(12) United States Patent
Kokeguchi

(10) Patent No.: US 7,267,913 B2
(45) Date of Patent: Sep. 11, 2007

(54) RECORDING MATERIAL AND IMAGE FORMING METHOD

(75) Inventor: Noriyuki Kokeguchi, Kokubunji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 517 days.

(21) Appl. No.: 10/792,837

(22) Filed: Mar. 5, 2004

(65) Prior Publication Data

US 2004/0178986 A1 Sep. 16, 2004

(30) Foreign Application Priority Data

Mar. 10, 2003 (JP) ............... 2003-063004

(51) Int. Cl.
*G03C 7/00* (2006.01)
*B01J 13/22* (2006.01)
*B01J 13/02* (2006.01)
*G03F 7/027* (2006.01)

(52) U.S. Cl. ............... 430/33; 430/32; 430/34; 430/138; 430/292; 345/107

(58) Field of Classification Search ............ None
See application file for complete search history.

(56) References Cited

U.S. PATENT DOCUMENTS 6,583,780 B1* 6/2003 Kawai .................. 345/107
2004/0228981 A1* 11/2004 Liao et al. ............. 427/558

FOREIGN PATENT DOCUMENTS

WO WO00/49593 * 8/2000

* cited by examiner

*Primary Examiner*—John A. McPherson
(74) *Attorney, Agent, or Firm*—Finnegan, Henderson, Farabow, Garrett & Dunner, L.L.P.

(57) ABSTRACT

An image forming method is disclosed, comprising (a) imagewise exposing a recording material comprising on a support an image forming layer containing colored electrophoretic particles and a photopolymerizable compositon to light to perform photocuring and (b) applying an electric field to the recording material to migrate the electrophoretic particles.

28 Claims, 5 Drawing Sheets

RECORDING MATERIAL AND IMAGE FORMING METHOD

FIELD OF THE INVENTION

The present invention relates to a novel recording material which can be treated by the simplified dry-process and result in superior image lasting quality and an image forming method by the use thereof.

BACKGROUND OF THE INVENTION

Development of a technique for color printing which is simplified while producing no waste material is desired along with the recent explosive popularization of digital still cameras, internet infrastructure improvements and increased ecological concerns.

There are known a variety of color printing techniques. Silver halide color print systems produce waste material in the processing stage, increasing an environmental load. Ink-jet printing systems, sublimation type dye transfer systems and melt type dye transfer systems produce waste materials such as cartridges and ribbons in the color material supplying section.

Print systems not producing waste material include, for example, a system employing image formation by a thermal head and photo-fixing, as described in JP-A No. 6-127121 (hereinafter, the term JP-A refers to Japanese Patent Application Publication); a system using photosensitive microcapsules, a dye precursor and rupture of the microcapsules by applying pressure, as described in JP-A No. 2001-312058; a system using a color material and photosensitive microcapsules, as described in JP-A No. 2002-268237; and a system using a color developing agent precursor and a photosensitive microcapsule, as described in JP-A No. 2001-142204. There is also disclosed an electrophoresis display comprising colored particles described in JP-A No. 2001-2424292 and fixation of a microgel for medical diagnosis using photopolymerization in an electrophoretic analysis, as described in published Japanese translation of PCT international publication for patent application Nos. 10-508381 and 10-512043. However, none of the foregoing patent documents discloses a print recording technique relating to the present invention in which electrophoretically mobile colored particles and a photopolymerizable composition are used in combination, and photo-curing and electrophoresis are combined.

SUMMARY OF THE INVENTION

It is an object of the present invention to provide an image forming method by the use of a recording material having a noble composition and a simplified processing method, leading to color prints exhibiting superior image lasting quality.

One aspect of the invention is directed to an image forming method comprising (a) imagewise exposing a recording material comprising on a support colored electrophoretic particles and a photopolymerizable composition to light to perform photocuring and (b) applying an electric field to the recording material to migrate the electrophoretic particles.

Another aspect of the invention is directed to a recording material comprising on a support colored electrophoretic particles and a photopolymerizable composition.

DETAILED DESCRIPTION OF THE INVENTION

Figure 1:
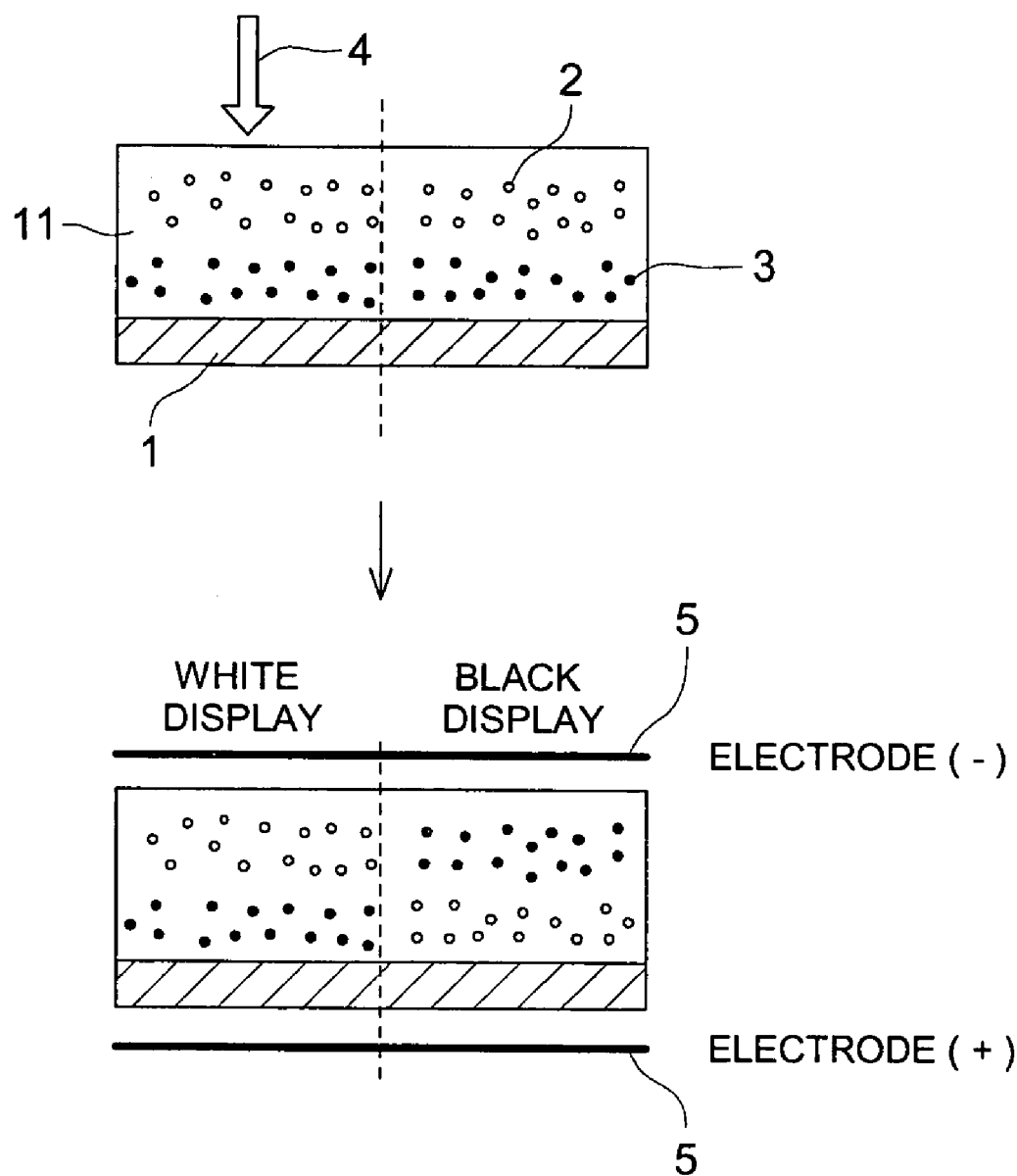
FIG. 1 illustrates one example of the image forming method relating to the invention, wherein a recording material, which comprises electrophoretic whit particles (2) and black particles (3) and a photopolymerizable composition (11) on a support (1), is exposed to perform photocuring (4) and then, sandwiched between electrodes (5) to apply an electric field to migrate the colored particles, performing white and black displays.

In this invention, the recording material comprises on a support colored electrophoretic particles and a photopolymerizable composition. Electrophoresis, which is one of electro-kinetic effects, is the migration of small particles in an electric field toward an electrode. In this invention, the electrophoretic particles refer to particles capable of migrating in an electric field toward an electrode. Thus, the electrophoretic particles can move in one direction toward one of two electrodes when an electric field is applied thereto. In one preferred embodiment of this invention, colored electrophoretic particles are white particles and black particles. In another embodiment of this invention, the electrophoretically mobile colored particles include yellow particles, magenta particles and cyan particles. The electrophoretic colored particles usable in this invention include any organic or inorganic particles exhibiting electrophoretic mobility, which may not be necessarily a single chemical composition and may be a mixture thereof. Coloring may be anyone of white, black, yellow, magenta and cyan.

White particles include inorganic compounds such as barium sulfate, calcium carbonate, aluminum oxide, zinc oxide, magnesium oxide, zinc hydroxide, magnesium hydroxide, magnesium phosphate, magnesium hydrogen phosphate, alkaline earth metal salts, talc, kaolin, zeolite, acid clay, glass and organic compounds such as polyethylene, polystyrene, acryl resin, ionomer, ethylene vinylacetate copolymer resin, benzoguanamine resin, urea-formalin resin, melamine-formalin resin and polyamide resin, which may be a simple substance or a composite thereof and which may be in the form containing voids capable of varying a refractive index. Of the foregoing compounds, titanium dioxide is preferably used in this invention, including anatase type and rutile type crystals. There are also usable titanium dioxide surface-treated with inorganic oxides [e.g., $Al_2O_3$, AlO(OH), $SiO_2$] and one which are further treated with organic compounds such as trimethylol ethane, triethanolamine acetate and trimethylcyclosilane.

Black particles usable in this invention include carbon black, non-magnetic iron oxide, graphite and their mixtures. Non-magnetic iron oxide may be doped with $\alpha$—$Fe_2O_3$, tungsten, molybdenum manganese or chromium to promote blackening. Preferred carbon black has an average primary particle size of 10 to 60 nm, and having a pH pf at least 6, a volatile content of 2% or less, a dibutyl phthalate absorbing amount of 10 to 200 ml per 10 g and a bulk density of 700 g/l or less.

Colored particles include inorganic material, organic material and organic-inorganic composite material. Further, there are also usable composite particles of a pigment and polymeric resin, and those of polymeric resin impregnated or mordanted with dyes. Examples of organic pigments include anthraquinone type pigments such as aminoanthraquinone, anthrapyridine, flavanthrone, anthoanthorone, indanthrone, pyranthrone and violanthrone; condensed polycyclic pigments such as perylene, perynone, quinacrydone, thioindigo, dioxazine, isoindolinone, quinophthalone, diketopyrrolopyrrole, benzimidazolone and metal complexes; copper phthalocyanine pigments such as copper phthalocyanine, copper halide phthalocyanine, copper sulfonate phthalocyanine chelate; non-metallic phthalocyanine pigments; azo-chelate pigments such as acetoacetic acid anilide type, pyrazolone type, β-naphthol type, β-oxynaphthoeic acid type and β-oxynaphthoeic acid anilide type; insoluble azo pigments or condensed azo pigments; lake pigments of acidic or basic dyes; and s nitro or nitroso pigments. Inorganic pigments include, for example, zinc white, titanium dioxide, red iron oxide, chromium oxide, cobalt blue, iron black, alumina white, yellow iron oxide, zinc sulfide, cinnabar, cadmium yellow, cadmium red, Prussian blue, yellow lead, zinc chromate, molybdenum red, barium sulfate, calcium carbonate, water containing silicate, ultramarine blue, manganese violet, aluminum powder, bronze powder, and zinc powder.

Examples of composite particles of a pigment and polymeric resin include those described in JP-A Nos. 2002-311646, 2003-15352, 2002-236386, 2002-214913, 2001-281928, and 2001-249497.

As a dye coloring component are usable commonly known dyes. Specific examples thereof include dyes described in European Patent No. 549,489; dyes ExF2 to 6 described in JP-A No. 7-152129; dyes AI-1 to -11 described in JP-A No. 3-251840, page 308; dyes described in JP-A No. 6-251840; dyes described in JP-A No. 6-3770; compounds represented by general formulas (I), (II) and (III) described in JP-A No. 1-280750, page 2, left column; compounds (1) to (45) described in ibid, page 3, left lower column to page 5, left lower column; compounds described in JP-A No. 1-150132; compounds described in Moriga, Yoshida, "Senryo to Yakuhin" (Dye and Chemicals), No. 9, page 84 (Kaseihin Kogyo Kyokai); "Shinban Senryo Binran" Dye Handbook) page 242 (Maruzen, 1970); R. Garner "Reports on the Progress of Appl. Chem." 56, page 199 (1971); "Senryo to Yakuhin", No. 19, page 230 (Kaseihin Kogyo Kyokai 1974); "Shikizai" (Colorant Material) No. 62, page 288 (1989), "Senryo Kogyo" (Dyestuff Industry) No. 32, page 208; and compounds in Research Disclosure (hereinafter, also denoted simply as RD) vol. 176, Item 17643 (December, 1978), page 25-26; RD vol. 184, Item 18431 (August, 1979), page 648-650; and RD vol. 308, Item 308119 (December, 1989), page 1003.

Examples of dye-mordanted polymeric resin include compounds described in U.S. Pat. No. 4,500,626, col. 58-59; JP-A No. 61-88256, page 32-41; and JP-A Nos. 62-244043 and 62-244036.

Examples of preferred dyes used for yellow particles include Color Index (hereinafter, denoted simply as C.I.) Direct Yellow, C.I. Acid Yellow 23, C.I. Acid Yellow 79, C.I. Pigment Yellow 128 and compounds designated as C.I. Nos. Y-3, Y-167, Y-97, Y-74, Y-12, Y-14, Y-17, T-55, Y-83, Y-154, Y-95, Y-193, Y-83, Y-34, Y-128, Y-93, Y-110, Y-139, Y-199, Y-147, Y-109, Y-13, Y-151, and Y-154. Examples of preferred dyes used for magenta particles include Acid 52, C.I. Projet Mazenta, C.I. Pigment Red 122, and compounds designated as C.I. Nos. R-48:1, R-53:1, R-49:1, R-48:3, R-48:2, R-57:1, R-63:1, R-58:4, 0-16, R-112, R-3, R-170, R-5, R-146, R-81, V-19, R-122, R-257, R-254, R-202, R-211, R-213, R-268, R-177, R-17, R-23 and R-31. Examples of preferred dyes used for cyan particles include C.I. Acid Blue 9, C.I. Direct Blue 199, C.I. Pigment Blue 15:3, and compounds designated as C.I. Nos. B-15, B-15:1 to 15:4, and B-27.

The photopolymerizable composition of this invention is a general term, including a photopolymerizable compound, photopolymerization initiator, spectral sensitizer, plasticizer, surfactant and photosensitivity enhancing agent. The photopolymerization composition preferably comprises at least a photopolymerizable compound, a photopolymerization initiator and a spectral sensitizer.

As a photopolymerizable compound are usable compounds containing one or plural vinyl groups. Examples of such a vinyl group-containing compound include acrylic acids, acrylic acid esters, acrylic acid amides, methacrylic acids, methacrylic acid esters, methacrylic acid amides, anhydrous maleic acid, maleic acid esters, itaconic acids, itaconic acid esters, styrenes, vinyl ethers, vinyl esters, N-vinyl heterocyclic compounds, aryl ethers, vinyl esters, allyl esters, and compounds containing an acryloyl group, methacryloyl group, allyl group, unsaturated polyester group, vinyloxy group or acrylamido group.

As the photopolymerization initiator is usable any compound capable of providing, upon exposure to light, a trigger which allows a photopolymerizable compound to polymerize. Such a trigger includes radical-generating compounds and compounds generating an ionic compound such as cation or anion. Examples of radical generation include generating a free radical through Norrish type I cleavage as in benzoin alkyl ether (halides, phosphineoxide compounds, organic sulfur compounds, oxime esters, peroxides, etc.), a system of efficiently generating a free radical upon interaction with other molecule, radical generating systems described in Monroe, Chemical Review [93], 435-446 (1995); S. P. Pappas, J. Rad. Curing, 14 [3], 6 (1987); G. L. Bassi, J. Rad. Curing, 14 [3], 18 (1987); E. Kustormann, Wiss. Zeitschr. THLM, 29 [3], 287 (1987); K. Tokumaru, "Zokanzai", Kodan-sha Scientific, page 64 (1987); A. Umehara "Kobunshi-gakkai 87/3 Insatsu-Johokiroku Kenkyu-kai", page 5 (1987); and "Photopolymer Technology" Nikkankogyo Shinbunsha (1988), and a dye sensitizing system. Specific examples of such a radical generating compound include aromatic carbonyl compounds, acetophenones, organic peroxides, dienylhalonium salts, organic halogen compounds, 2,4,6-substituted Striazines, 2,4,5-triaryl imidazole dimmer, azo compounds, metal arene complexes, titanocene compounds, organic borate complex or its dye salt, and compounds described in JP-A Nos. 62-150242, 64-60606, 3-20260 and 3-116043.

The spectral sensitizer used in this invention is a compound which is capable of transferring, upon light absorption, an electron or energy to the foregoing photopolymerization initiator or photopolymerizable compound, and, for example, commonly known spectral sensitizing dyes are usable in this invention. Examples of a preferred sensitizing dye include cyanine dyes, merocyanine dyes, complex cyanine dyes, oxanol dyes, squalium dyes, triarylmethane dyes, pyrylium dyes, holopolar cyanine dyes, hemicyanine dyes, styryl dyes and hemioxonol dyes. Specific examples there of are compounds described in U.S. Pat. No. 4,617,257; JP-A Nos. 59-180550, 64-13546, 5-45828, 5-45834; U.S. Pat. No. 3,615,641; JP-A Nos. 63-23145; U.S. Pat. Nos. 4,183,756 and 4,225,666; RD 176 Item 17643 (December, 1978), RD 184 Item 18431 (August, 1979), RD 187 Item 18716 (November 1979), and RD 308 Item 308119 (December 1989). In this invention, a spectral sensitizer of which visible absorption is decolorized by self absorption or the photopolymerizable composition such as a radical generating agent is preferable.

The photopolymerizable composition may be a multi-functional compound having plural functions chosen from the foregoing photopolymerizable compound, photopolymerization initiator and spectral sensitizer.

In one preferred embodiment of this invention, the recording material comprises on a support microcapsules including electrophoretic colored particles and a photopolymerizable composition. Microcapsules can be prepared using commonly known techniques. Specific examples thereof are described in U.S. Pat. Nos. 2,800,457, 2,800,458, 3,111,407, 3,281,282, 3,287,154, 3,418,250, 3,660,304, 3,773,695, 3,793,68, 3,796,669, 3,914,511, 4,001,140, 4,087,376, 4,089,802, 4,025,455; JP-B Nos. 38-19574, 42-446, 42-771, 36-9168, 48-40347, 49-24159, 48-80191, 48-84086 and 51-9079 (hereinafter, the term JP-B refers to Japanese Patent Publication); JP-A No. 51-9079; British Patent Nos. 952, 807, 965,074, 990,443 and 930,422; and T. Kondo "Microcapsule" Nippon Kikaku Kyokai (1991). Methods for preparing microcapsules include a phase separation from an aqueous solution, coacervation, interfacial polymerization, monomer in situ polymerization, melt dispersion cooling method and a spray drying method. Examples of microcapsule wall material include polyurethane, polyurea, polyamide, polyester, polycarbonate, isocyanate polyol, isocyanate, urea-formaldehyde resin, ureaformaldehyde-resorcinol resin, melamine-formaldehyde resin, and hydroxypropyl cellulose resin. Microcapsules preferably have an average particle size of 0.01 to 50 µm. In this invention, microcapsules can include colored electrophoretic particles, a photopolymerizable compound, a spectral sensitizer and a photopolymerization initiator.

In one preferred embodiment of this invention, the recording material comprises colored electrophoretic particles and a photopolymerizable composition on a support which was previously recessed at regular intervals, i.e., a support having recesses at regular intervals.

Synthetic plastic films are preferably used as a support of this invention, including polyolefines such polyethylene and polypropylene, polycarbonates, cellulose acetate, polyethylene terephthalate, polyethylene dinaphthalene dicarboxylate, polyethylene naphthalate, polyvinyl chloride, polyimide, polyvinyl acetals and syndiotactic polystyrenes. These can be obtained by methods described in JP-A Nos. 62-117708, 1-46912 and 1-178505. There are also usable paper supports such as photographic base paper, printing paper, baryta paper and resin-coated paper, a support provided with a reflection layer on the foregoing plastic film and supports described in JP-A No. 62-253195 (page 29-31). Furthermore, supports described in RD No. 17643 (page 28), RD No. 18716 (page 647, right column to page 648, left column) and RD No. 307105 (page 879) are also preferably used. The foregoing supports may be subjected to a thermal treatment at a temperature lower than Tg to reduce roll set curl, as described in U.S. Pat. No. 4,141,735. The support surface may be subjected to a surface treatment to enhance adhesion of the support onto a component layer. There are applicable surface treatments such as a glow discharge treatment, UV irradiation treatment, corona discharge treatment and flame treatment. Furthermore, supports described in "Kochi Gijutsu" No. 5 (Mar. 22, 1991, Aztec Co.), page 44-149 are usable. There are also usable supports described in RD No. 308119, page 1009 and Product Licensing Index vol. 92, page 108, item "Support".

Recessing a support can be conducted by commonly known processing, such as laser processing, calendaring, and rib-paste printing by using a screen plate. Recesses (or hollows) may be arranged in a stripe form or in a honeycomb form. Plural recesses are arranged at regular intervals and the interval preferably is 1 to 300 µm. The depth of the recess is preferably 0.3 to 0.7 times the thickness of the support. In the laser processing, the output of an excimer laser is controlled to control the recess depth. In the calendaring process, the roll, whose surface has been thermally sprayed with ceramic and engraved by a laser, is heated to a temperature higher than the glass transition temperature of the support and pressed onto the support. In rib-paste printing by using a screen plate, a rib-paste is coated on a support using a screen with a pitch of 1 to 300 µm to control the depth. At least colored electrophoretic particles and a photopolymerizable composition are allowed to be included in the respective hollow portions of the support.

In one preferred embodiment of this invention, the recording material comprises colored electrophoretic particles, a photopolymerizable composition and spacer particles. The spacer particles may be in a spherical form or a cylindrical form. Spherical spacer particles preferably have an average particle diameter of 0.01 to 50 µm. The spacer particles may be comprised of photosensitive resin or non-photosensitive resin. A mixture of novolak resin and naphthoquinonediazido-disulfonic acid ester is usable as a positive-working photosensitive resin. Negative-working photosensitive resins usable in this invention include, for example, a cyclized rubber-bisazido type, a phenol resinazido type and a chemical sensitization type. Epoxy resin, acryl resin, urethane resin, polyester resin, polyimide resin and polyolefin resin are also usable in this invention. Silica, barium sulfate, barium carbonate, calcium carbonate, talc, zilconia, magnesia, beryllia, mullite, cordierite, glass-ceramic powder barite may be incorporated into the spacer particles to enhance mechanical characteristics of the particles.

In one preferred embodiment of this invention, the recording material comprises, on a support, colored electrophoretic particles and a photopolymerizable composition, and further comprising a white light-scattering layer. The white light-scattering layer is referred to as a component layer exhibiting a color tone having an absolute value of a* of 10 or less, an absolute value of b* of 10 or less and an absolute value of L* of 70 or more in terms of the Lab chromaticity system. The white light-scattering layer is comprised of white particles and a binder. Alternatively, the white light-scattering layer is comprised of a binder containing light-scattering voids differing in refractive index from the binder. Binders described in JP-A No. 64-13546, page 71-75 are usable in this invention. Binders usable in this invention are transparent or semitransparent, and are generally colorless, including natural polymers and synthetic polymer resins. Specific examples thereof include gelatin arabic gum, poly (vinyl alcohol), hydroxyethyl cellulose, cellulose acetate, cellulose acetate butyrate, poly(vinyl pyrrolidone), casein, starch, poly(acrylic acid), poly(methyl methacrylate), poly (vinyl chloride), poly(methacrylic acid), copoly(styrene-maleic acid), copoly(styrene-acrylonitrile), copoly(styrenebutadiene), poly(vinyl acetal) such as poly(vinyl formal) and poly(vinyl butyral), polyester, polyurethane, phenoxy resin, poly(vinylidene chloride), polyepoxide, polycarbonate, poly (vinyl acetate), cellulose ester, polyamide, poly(vinyl acetate), cellulose ester and polyamide. Hydrophobic transparent binders include poly(vinyl butyral), cellulose acetate, cellulose acetate butyrate, polyester, polycarbonate, poly (acrylic acid) and polyurethane.

In one preferred embodiment of this invention, the recording material comprises, on a support, colored electrophoretic particles and a photopolymerizable composition, and further comprises a charge controlling agent. The charge controlling agent refers to a compound which is allowed to be adsorbed or bonded onto the electrophoretic particle surface, or allowed to be occluded in colored electrophoretic particles, providing an electrostatic charge and charging stability to the colored electrophoretic particles. Examples of the charge controlling agent include anionic surfactants, cationic surfactants, amphoteric surfactants, metal soap, nonionic surfactants, fluorinated surfactants, block-type polymer, graft type polymer, sulfonated oil, alkyl phosphoric acid ester, succinic acid imide, a metal complex of hydroxycarboxylic acid, metal complex of an azo compound, naphthol type compounds, a metal compound of a naphthol type compound, Nigrosine type dye, quaternary ammonium salts, triphenymethane type compounds and salicylic acid derivatives.

In one preferred embodiment of this invention, the recording material comprises colored electrophoretic particles and a photopolymerizable composition, and further comprising an organic solvent exhibiting a relative dielectric constant of 2.5 to 10.0 at 20° C. The relative dielectric constant is referred to as a dielectric constant relative to that of vacuum at 20° C., which can be determined by using a commercially available measurement apparatus for dielectric constants, for example, HP E5050A HEWLET PACKRD. Dielectric constant values are described in "Kagaku Binran" (Handbook of Chemistry, 4th edition, Maruzen Co., Ltd.) and "Yozai (Solvent) Handbook" (1st edition, Kodansha Scientific). In cases where an objective material to be measured for dielectric constant is not liquid at 20° C., the objective material is thermally melted, followed by formation of supercooled liquid to be measured. Alternatively, the objective material is mixed with a liquid having a known relative dielectric constant and the relative dielectric constant of the mixture is determined to extrapolate the relationship between weight fraction and relative dielectric constant. Specific example of such a solvent include ethylbenzene, dibutylbenzene, dibutyl ether, dipropylamine, pentylamine, ethylhexylamine, cyclohexylamine, chloroform, propyl propionate, butyl propionate, butylamine, butyl acetate, bromobenzene, ethylene glycol dimethyl ether, methyl acetate, ethyl propionate, chlorobenzene, piperidine, ethyl acetate, propyl acetate, chloropentane, methyl acetate, butyl bromide, dicyclohexylamine, aniline, tetrahydrofuran, butyl chloride, morpholine, propyl chloride, methylene chloride, diethyl malonate, propyl bromide, dichloroethane, chlorinated paraffin, dibutyl phthalate, dioctyl phthalate, tri-2-ethylhexyl-phosphate, tricresyl phosphate, and compounds S-1 through S-18 described in JP-A No. 2001-117205.

In one preferred embodiment of this invention, the recording material comprises colored electrophoretic particles and a photopolymerizable composition, and further comprising a protective layer containing a polyvinyl alcohol. The polyvinyl alcohol may be any compound having a partial structure (or repeating unit) of —[$CH_2CH(OH)$]— and also including modified polyvinyl alcohols such as terminal alkyl-modified polyvinyl alcohol, terminal mercapto group-modified polyvinyl alcohol, acetylated polyvinyl alcohol, butyralated polyvinyl alcohol and carboxylated polyvinyl alcohol. A polyvinyl alcohol preferably has a saponification degree of 80% to 99.9% and a polymerization degree of 300 to 3500. Commercially available compounds are found in "PVA Seihin Sogo Catalog" (Shin-Etsu Chemical Co., Ltd) and "Kuraray Poval" (KURARAY CO., LTD.). Examples of specific compounds include A, C-17GP, C-20, C-25GP, MA05GP, MA-17GP, MA-23GP, PA-05GP, PA-10GP, PA-15GP, PA-18GP, PA-20GP, AND GA-24GP, which are available from Shin-Etsu Chemical Co., Ltd.; PVA-105, PVA-117, PVA-120, PVA-124, PVA-126H, PVA-135H, PVA-617, PVA-624, PVA-706 MP-102, MP-202, MP-103, MP-203, which are available from KURARAY CO., LTD. Polyvinyl alcohols are detailed in H. Nagano, S. Yamane & K. Toyoshima "Poval" (Kobunshi-Kankokai), and C. A. Finch, Polyvinyl Alcohol-Developments (John Wiley & Sons Co. Ltd., 1992) page 77-156. The protective layer containing polyvinyl alcohol may further contain a polymer forming the foregoing binder.

Incorporation can be conducted in accordance with methods described in European Patent No. 698,816 and U.S. Pat. Nos. 5,567,473 and 5,695,862.

In one preferred embodiment of this invention, the recording material comprises colored electrophoretic particles and a photopolymerizable composition, and the overall water content of constituent layer(s) on the side of the electrophoretic particles is 0.01% to 10%. The water content is defined as follows. That is, after the recording material is allowed to stand at 40° C. and 60% RH for 48 hr., the weight of the recording material per unit area is designated as weight (1); the weight of the recording material per unit area immediately after being allowed to stand in vacuo is designated as weight (2); and the water content is defined according to the following equation:

$$\text{water content (\%)} = [\text{weight}(1) - \text{weight}(2)]/\text{weight}(2) \times 100$$

The water content can be adjusted to an objective value by selecting a binder of the recording material, controlling drying conditions in the process of preparing the recording material and selecting sealing material for the recording material. A water content of less than 0.01% resulted in reduced elasticity of the recording material, leading to deteriorated flaw resistance during transportation; and a water content of more than 10% affects the dielectric constant of the recording material, causing unacceptable conditions such as instability for the electric field strength provided to electrophoresis characteristics of the colored particles.

In one preferred embodiment of this invention, the recording material comprises colored electrophoretic particles and a photopolymerizable composition, and the surface of the electrophoretic particle side of the recording material exhibits a surface roughness (Ra) of 0.01 to 2.0 µm. The surface roughness (Ra) refers to a center-line mean roughness, as defined in JIS B0601 or ISO 468-1982. An Ra of less than 0.01 µm results in deteriorated transportability, while being overlapped, due to surface smoothness, and a Ra of more than 2.0 results in a non-uniform electric field strength caused by the uneven surface, leading to unstable electrophoresis characteristics.

In one embodiment of the image forming method, a recording material which comprises colored electrophoretic particles and a photopolymerizable composition on a support is exposed to light to perform photocuring (or photopolymerization) and then, an electric field is applied to the recording material to cause the colored electrophoretic particles to migrate in the electric field. Thus, the method comprises (i) imagewise exposing the recording material to cause photopolymerization (or photocuring) and (ii) allowing the exposed recording material to be placed in an electric field to migrate the electrophoretic particles. In general, the electrophoretic migration rate or electrophoretic mobility is proportional to the dielectric constant of the electrophoresis medium and the zeta potential of the electrophoretic particles, and is inversely proportional to the viscosity of the electrophoresis medium. In the foregoing image forming method, every picture element (pixel) is exposed to light at an intensity and a wavelength corresponding to the output image to cause the electrophoresis medium to be photocured to differentiate the electrophoretic migration rate or electrophoretic mobility and then, an electric field is applied thereto to cause the electrophoretic particles to migrate to form an image.

A laser light source is preferably employed as a light source for light exposure. Examples of the laser light source include gas lasers (e.g., Ar laser, He-Ne laser, carbon-dioxide laser, excimer laser), solid lasers (e.g., ruby laser, Pr-YLF laser, Nd-YAG laser, Nd-glass laser, Q switch laser), semiconductor laser (e.g., end face emitting type semiconductor laser, face emitting type semiconductor laser) and dye lasers. A SHG (second harmonic generation) element may be used in combination with a solid laser to obtain a specific wavelength. A semiconductor laser is advantageously used in terms of apparatus compactness. Semiconductor lasers having central oscillation wavelengths of 680 nm, 532 nm and 410 nm can be used as red, green and blue, respectively, to separate color sensitivity based on wavelength. The light irradiation energy preferably is 0.01 to 50 $mJ/cm^2$ in terms of storage stability of the recording material and compactness of the apparatus.

Application of an electric field can be achieved by allowing a recording material to pass between parallel electrode plates or paired charged rollers or by providing an ion flow onto the recording material. Specifically, there can be used apparatuses described in JP-A Nos. 11-10936, 10-151790, 11-338278, 2000-221784, 2002-278127, 2001-330977, 2001-83732 and 8-82949.

In one embodiment of the image forming method of the invention, an electric field is applied to the recording material which comprises colored electrophoretic particles and a photopolymerizable composition on a support, to allow the colored electrophoretic particles to migrate and then, the recording material is exposed to light to perform photocuring. Application of an electric field may be performed by controlling the intensity of the electric field applied to the respective picture elements and the applying time. Alternatively, a uniform electric field may be applied to the total picture elements. Photocuring the electrophoretic medium after application of an electric field can secure electrophoretic particles, thereby leading to enhanced weather resistance of formed images. Application of an electric field to every picture element reduces the light irradiation stage, resulting in a compact apparatus.

In one preferred embodiment of this invention, photocuring before and after application of an electric field to migrate the electrophoretic particles leads to formation of images exhibiting superior sharpness and light exposure using the same light source leads to miniaturization of the apparatus.

In one preferred embodiment of the image forming method, an electric field is applied to a recording material which comprises colored electrophoretic particles and a thermosetting resin on a support to migrate the colored electrophoretic particles to and then, the recording material is heated at a temperature of 60 to 220° C. to perform heat curing. Application of the electric field is conducted similarly to the manner described above and heat-curing the electrophoretic medium comprising the thermosetting resin can secure the electrophoretic particles, leading to enhanced weather resistance of formed images. Thermosetting resins usable in this invention include polyisocynate resin, epoxy resin, acryl resin, silicone resin, polyurethane resin, urea resin, phenol resin, formaldehyde resin, epoxy-polyamide resin, melamine resin and alkyd resin. Specific examples thereof include Takenate D-102, Takenate D-110N, Takenate D-200, Takenate D-202 (which are available from Takeda Chemical Industries, Ltd.); Desmodule L, Desmodule IL, Desmodule N, Desmodule HL (which are available from Sumitomo Bayer Co.); Coronate L, Coranate HL, Coronate 2030, Coronate 2031, Millionate MR, Millionate MTL (which are available from Nippon Polyurethane Co.). The thermosetting resin preferably has a glass transition temperature of 60° C. to 150° C. A glass transition temperature lower than 60° C. results in insufficient fixation of the electrophoretic particles, leading to deteriorated weather resistance. A glass transition temperature higher than 220° C. results in unacceptable conditions such as deteriorated surface gloss of the recording material.

In one preferred embodiment of this invention, the recording material, which comprises colored electrophoretic particles and a photopolymerizable composition on a support, is exposed to light having plural peak wavelengths in the range of 400 to 700 nm to perform photocuring. Photocuring can be performed preferably using a blue light of 400 to 500 nm, a green light of 500 to 600 nm and a red light of 600 to 700 nm.

In the recording material according to this invention, there are usable a chemical sensitizer, a spectral sensitizer, a supersensitizer, an antifoggant and a stabilizer, an anti-staining agent, a color image stabilizer, a brightening agent, a UV absorber, a light scattering agent, a filter dye, a binder, an antistatic agent, a hardener, a plasticizer, a lubricant, a surfactant, a coating aid, a matting agent and a developer, as described in RD 308119, as described in RD 17643, RD 18716 and RD 308119.

EXAMPLES

The present invention will be further described based on examples but the embodiments of this invention are by no means limited to these.

Example 1

A paper support laminated with a high density polyethylene on both sides of base paper of 180 $g/m^2$ was prepared, in which a polyethylene melt containing 15% by weight of surface-treated anatase type titanium oxide was laminated on the image forming side to obtain a reflection support. A solution comprising a mixture of 25 parts of pentaerythritol tetraacrylate, 75 parts of pentaerythritol hexaacrylate, 0.2 part of pentaerythritol tetrakis-3-mercaptopropionate and 0.7 part of Irgacure 261 (available from Ciba Speciality Chemicals Co.) was dispersed in an amount of 10 parts, in an oil droplet form, in a 10% aqueous solution of polyvinyl alcohol (PVA 117, Kuraray Co.) containing 3 parts of nonionic surfactant BO-10X (available from Nikko Chemicals Co.) and having titanium oxide and carbon black dispersed therein. The thus obtained mixture solution was coated on the foregoing support and dried, and further thereon, a protective layer of Cybinol EK-55 (acryl resin, available from Cyden Chemicals Co.) was coated in an amount of 5 g/m² and dried to prepare recording material Sample 1 shown in FIG. 1.

As shown in FIG. 1, after being subjected to pattern exposure (i.e., imagewise light exposure) at 1000 lux for 30 sec., Sample 1 was sandwiched between parallel electrodes and ±40 volts electric field was applied thereto. As a result, a tone pattern comprised of white (minimum reflection density) and black (maximum reflection density) was obtained in accordance with the exposure pattern.

After image formation, Sample 1 was allowed to stand in a conditioning oven at 80° C. and 60% RH to undergo accelerated aging and evaluated with respect to variation in reflection density between before and after aging, based on the following equation:

variation in reflection density (%)=[(maximum reflection density after aging minus minimum reflection density after aging)/(maximum reflection density before aging minus minimum reflection density before aging)]×100.

It was proved that Sample 1 exhibited a reflection density variation of 90% and superior storage stability was achieved.

Example 2

Figure 2:
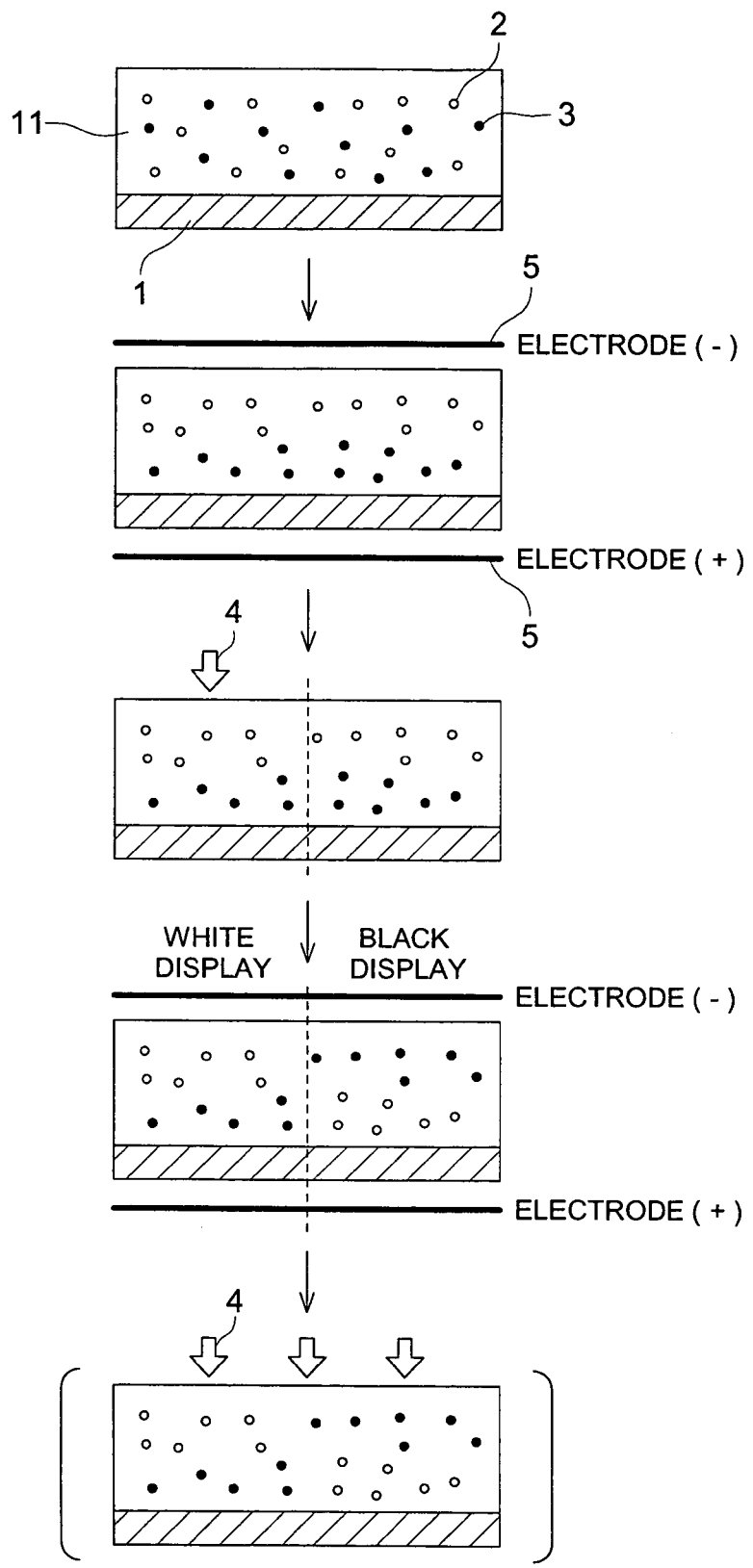
FIG. 2 also illustrates another example of the invention, in which an electric field is applied prior to exposure to arrange for colors of colored particles to be uniform.

Sample 2 was prepared similarly to Sample 1 in Example 1. As shown in FIG. 2, Sample 2 was sandwiched between parallel electrodes, and a ±40 volt electric field was applied thereto to match colors (or to arrange for colors of colored particles to be uniform). Further, after being subjected to pattern exposure at 1000 lux for 30 sec., Sample 2 was sandwiched between parallel electrodes and a reversed ±40 volt electric field was applied thereto. As a result, a tone pattern comprised of white (minimum reflection density) and black (maximum reflection density) was obtained in accordance with the exposure pattern. Thus obtained Sample 2 was evaluated similarly to Example 1 and it was proved that Sample 2 exhibited a reflection density variation of 92% and superior storage stability was achieved.

Example 3

Sample 2 was prepared similarly to Sample 1 in Example 1. As shown in FIG. 2, Sample 2 was sandwiched between parallel electrodes, and a ±40 volt electric field was applied thereto to match tones. Further, after being subjected to pattern exposure at 1000 lux for 30 sec., Sample 2 was sandwiched between parallel electrodes and a ±40 volt reversed electric field was applied thereto. Thereafter, the sample was subjected to overall exposure to light at 1000 lux for 30 sec. The thus obtained sample was evaluated similarly to Example 1 and it was proved that the sample exhibited a reflection density variation of 97% and superior storage stability.

Example 4

Figure 3:
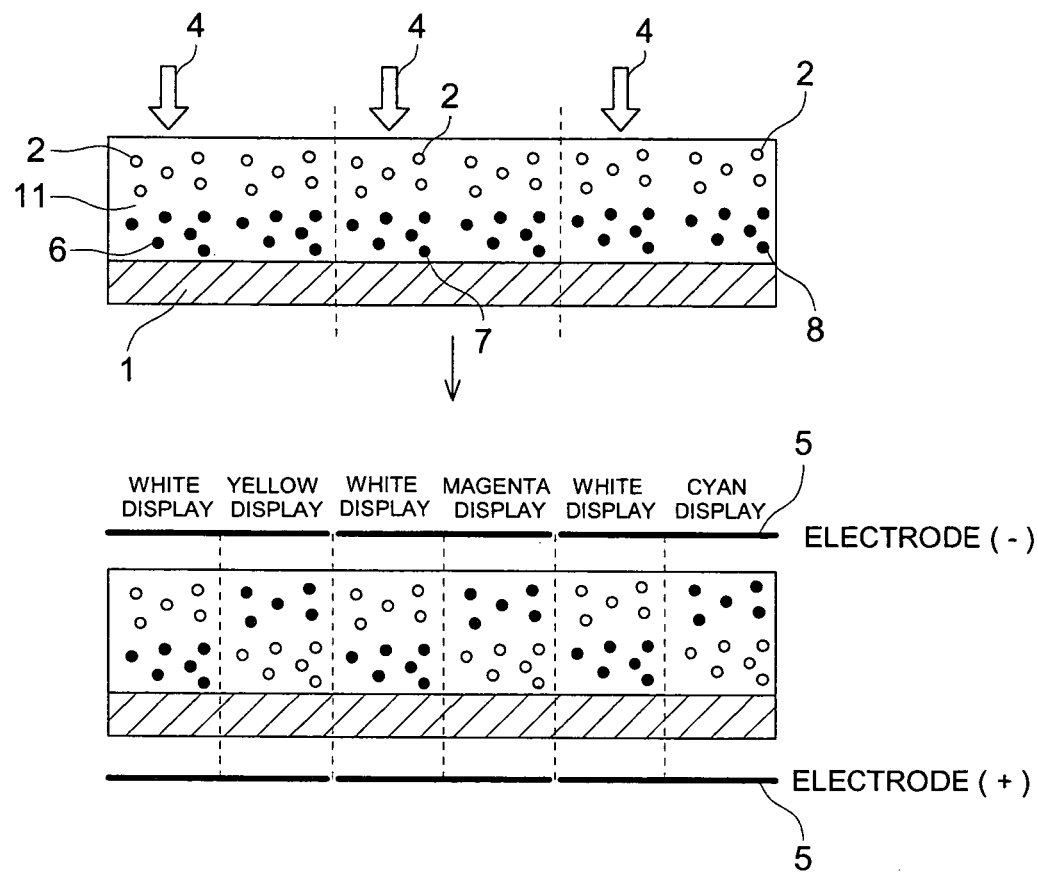
FIG. 3 illustrates an example of layer configurations relating to the invention in which yellow particles (6), magenta particles (7) and cyan particles (8) are contained together so that the method of the invention effectuates color display.

As shown in FIG. 3, Sample 3 was prepared similarly to Sample 1, provided that carbon black used in Sample 1 was replaced by each of C.I. Pigment Yellow 138, C.I. Pigment Red 184 and C.I. Pigment Blue 68 and the respective colors was coated in a stripe form by a printing method and dried. Parallel electrodes were arranged so as to correspond to the respective color stripes and the operation was conducted similarly to Example 1 to obtain a tone pattern comprised of white (minimum reflection density) and black (maximum reflection density). The thus obtained sample was evaluated similarly to Example 1 and it was proved that the sample exhibited a reflection density variation of 90% and superior storage stability was achieved. Further, a color image was obtained by separately adjusting the voltage applied to the parallel electrodes for the respective colors.

Example 5

Figure 4:
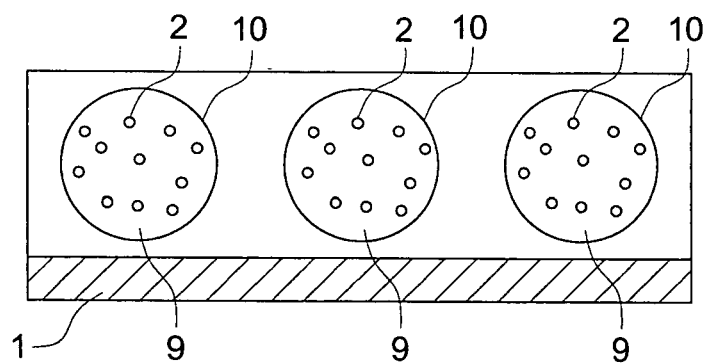
FIG. 4 illustrates a layer configuration in which colored electrophoretic particles (white particles), and the combination of a black dye and a photopolymerizable composition (9) are included in capsules (10).

A paper support laminated with a high density polyethylene on both sides of base paper of 180 g/m² was prepared, in which a polyethylene melt containing 15% by weight of surface-treated anatase type titanium oxide was laminated on the image forming side to obtain a reflection support. A solution comprising a mixture of 25 parts of pentaerythritol tetraacrylate, 75 parts of pentaerythritol hexaacrylate, 0.2 part of pentaerythritol tetrakis-3-mercaptopropionate, 0.7 part of Irgacure 261 (available from Ciba Speciality Chemicals Co.), 10 parts of styrene-maleic acid copolymer, titanium oxide and dyes (Aldrich Blue N, Aldrich Sudan Red 7B) was mixed in an amount of 100 parts with 200 parts of an aqueous solution containing 10 parts of poly(styrenesulfonic acid) and dispersed using a homogenizer to obtain an emulsion. To the emulsion, an aqueous solution containing a melamine-formaldehyde resin polymer, having a pH of 9 was added and allowed to react at 55° C. for 4 hrs. with stirring. After adjusted to a pH of 7, the reaction mixture was cooled to obtain a dispersion of microcapsules having a melamine-formaldehyde resin as a wall material. The thus obtained microcapsule dispersion was added with a 10% aqueous polyvinyl alcohol solution (PVA 117, Kuraray) and coated on the foregoing reflection support and dried. Further thereon, Cybinol EK-55 (acryl resin, available from Cyden Chemicals Co.) was coated in an amount of 5 g/m² and dried to prepare recording material Sample 4 shown in FIG. 4. Image formation and evaluation of Sample 4 was conducted similarly to Example 1 and it was proved that the sample exhibited a reflection density variation of 94% and superior storage stability.

Example 6

Figure 5:
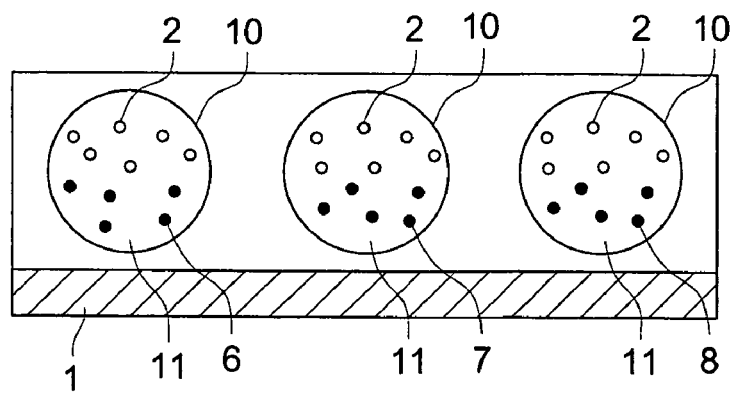
FIG. 5 illustrates a layer configuration in which yellow, magenta and cyan particles (6, 7, 8) are included in capsules (10), together with a photopolymerizable composition (11), thereby displaying colors.

Microcapsule dispersions differing in color were prepared, provided that dyes used in Example 4 were respectively replaced by C.I. Pigment Yellow 138, C.I. Pigment Red 184 and C.I. Pigment Blue 68. To the respective microcapsule dispersions, a 10% aqueous solution of polyvinyl alcohol (PVA 117, Kuraray) was added and coated on the reflection support in a matrix form and dried. Further thereon, Cybinol EK-55 (acryl resin, available from Cyden Chemicals Co.) was coated in an amount of 5 g/m² and dried to prepare recording material Sample 5 shown in FIG. 5. Image formation and evaluation of Sample 5 was conducted similarly to Example 4 and it was proved that the sample exhibited a reflection density variation of 95% and superior storage stability was achieved. Furthermore, a color image was obtained by separately adjusting the voltage applied to the parallel electrodes for the respective colors.

Example 7

Figure 6:
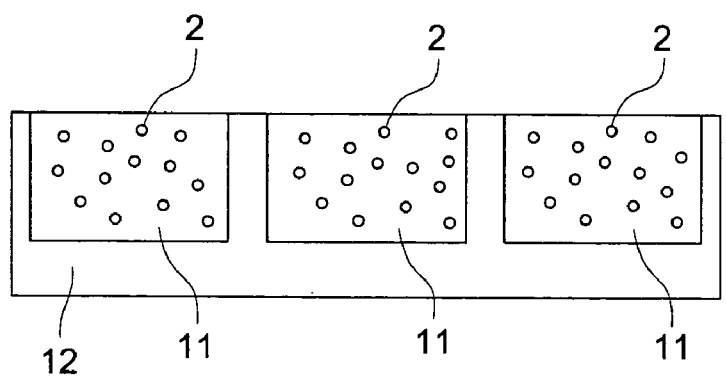
FIG. 6 illustrates a layer configuration applied onto a recessed support (12).

A 200 μm thick white PET support was perforated by calendaring on a molding roll to form a honeycomb-form pattern on the substrate. 100 Parts of a mixture comprising 25 parts of pentaerythritol tetraacrylate, 75 parts of pentaerythritol hexaacrylate, 0.2 part of pentaerythritol tetrakis-3-mercaptopropionate, 0.7 part of Irgacure 261 (available from Ciba Speciality Chemicals Co.), titanium oxide and dyes (Aldrich Blue N, Aldrich Sudan Red 7B) were dissolved in a solution. This solution was sealed into the respective perforations using an ink-jet coating method. Further thereon, Cybinol EK-55 (acryl resin, available from Cyden Chemicals Co.) was coated in an amount of 5 g/m² and dried to prepare recording material Sample 6 shown in FIG. 6. Image formation and evaluation of Sample 6 were conducted similarly to Example 1 and it was proved that the sample exhibited a reflection density variation of 91% and superior storage stability was achieved.

Example 8

Figure 7:
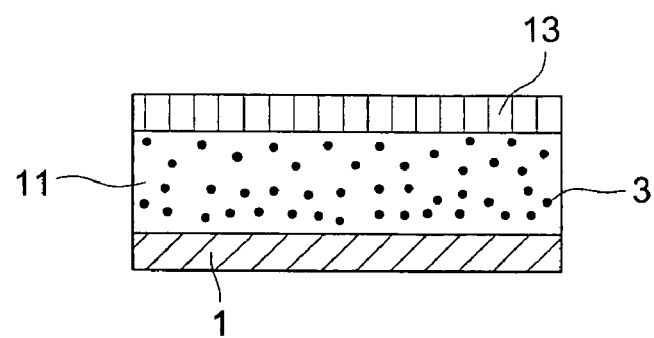
FIG. 7 illustrates a layer configuration in which a white light-scattering layer (13) is further added.

As shown in FIG. 7, Sample 7 was prepared similarly to Sample 1, provided that titanium oxide was removed and a white scattering layer comprising 8 parts of Eposta MS (available from NIPPON SHOKUBAI CO., LTD.), and 1 part of UE 3300 (available from UNITIKA LTD.) were provided in place of the protective layer. Image formation and evaluation of Sample 7 were conducted similarly to Example 1, provided that heating to 60° C. was simultaneously conducted with application of an electric field. It was proved that the sample exhibited a reflection density variation of 88%.

Example 9

Figure 8:
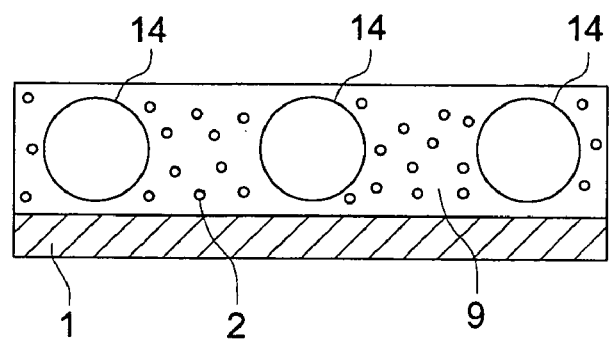
FIG. 8 illustrates a layer configuration in which spacer particles (14) are further added.

Sample 8, as shown in FIG. 8, was prepared similarly to Sample 1, provided that carbon black used in Sample 1 was replaced by dyes (Aldrich Blue N, Aldrich Sudan Red 7B) and acryl resin beads having an average particle size of 8 μm was added as spare particles to an aqueous polyvinyl alcohol solution. Image formation and evaluation of Sample 8 were conducted similarly to Example 1 and it was proved that the sample exhibited a reflection density variation of 89%.

Example 10

Sample 9 was prepared similarly to Sample 1, provided that titanium oxide used in Sample 1 was replaced by a titanium oxide adsorbed with succinic acid imide as a charge controlling agent and carbon black was replaced by dyes (Aldrich Blue N, Aldrich Sudan Red 7B). Image formation and evaluation of Sample 9 were conducted similarly to Example 1 and it was proved that the sample exhibited a reflection density variation of 93%.

Example 11

Samples 10-1, 10-2 and 10-3 were prepared similarly to Sample 1, provided that carbon black used in Sample 1 was replaced by dyes (Aldrich Blue N, Aldrich Sudan Red 7B), and diethyl oxalate (relative dielectric constant: 1.8), ethylene glycol dimethyl ether (relative dielectric constant: 5.5) and cyclohexanone (relative dielectric constant: 18.3) were respectively added. Image formation and evaluation of these samples were conducted similarly to Example 1 and it was proved that the Samples 10-1, 10-2 and 10-3 exhibited reflection density variations of 83%, 92% and 84%, respectively.

Example 12

Sample 11 was prepared similarly to Sample 1, provided that carbon black was replaced by dyes (Aldrich Blue N, Aldrich Sudan Red 7B and the protective layer was replaced by polyvinyl alcohol (MP-203, Kuraray). Image formation and evaluation of Sample 11 were conducted similarly to Example 1 and it was proved that the sample exhibited a reflection density variation of 90%.

Example 13

Samples 12-1 and 12-2 respectively having a water content of 1.0% and 15.0% were prepared similarly to Sample 1, provided that carbon black used in Sample 1 was replaced by dyes (Aldrich Blue N, Aldrich Sudan Red 7B) and drying conditions in the drying stage were varied. Image formation and evaluation of these samples were conducted similarly to Example 1 and it was proved that Sample 12-1 and 12-2 exhibited reflection density variations of 88% and 82%, respectively.

Example 14

Samples 13-1 and 13-2 were prepared similarly to Sample 1, provided that carbon black used in Sample 1 was replaced by dyes (Aldrich Blue N, Aldrich Sudan Red 7B) and silica matting agents having an average particle size of 3.0 μm and 1.0 μm were respectively added to the protective layer. Image formation and evaluation of these samples were conducted similarly to Example 1 and it was proved that Sample 13-1 and 13-2 exhibited reflection density variations of 81% and 86%, respectively.

Example 15

Sample 14 was prepared similarly to Sample 1, provided that carbon black used in Sample 1 was replaced by dyes (Aldrich Blue N, Aldrich Sudan Red 7B) and Takenate D-202 was added to oil droplets. Sample 14 was sandwiched between parallel electrodes, a ±40 volt electric field was applied thereto and the sample was heated at 80° C. for 30 sec. As a result, a tone pattern comprised of white (minimum reflection density) and black (maximum reflection density) was obtained in accordance with the exposure pattern. Image formation and evaluation of Sample 14 were conducted similarly to Example 1 and it was proved that the sample exhibited a reflection density variation of 85%.

Example 16

Figure 9:
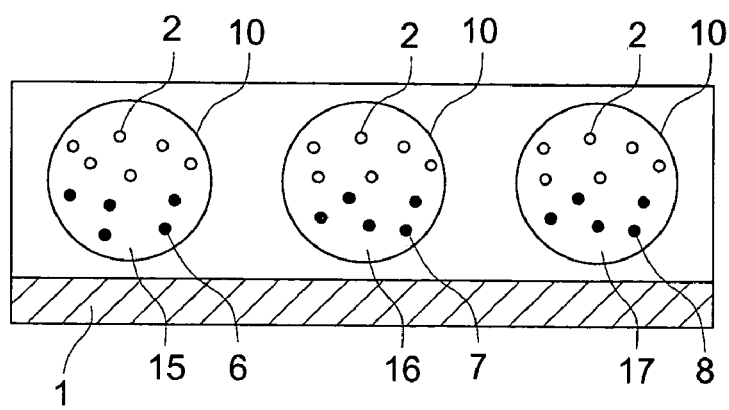
FIG. 9 illustrates a layer configuration in which a photopolymerizable composition is replaced by blue-sensitive, green-sensitive and red-sensitive compositions (15, 16, 17, respectively).

As shown in FIG. 9, Sample 15 was prepared similarly to Sample 4, provided that three kinds of microcapsules were prepared by replacing Irgacure 261 by 3,3'-dimethyl-1-heptylindo-3'-heptylthiacyanine-triphenyl-n-butylborate, 1,1'-di-n-heptyl-3,3,3',3''-tetramethylindocarbocyanin-etriphenyl-n-butylborate and 1,1'-di-n-heptyl-3,3,3',3''-tetramethylindodicarbocyanine-triphenyl-n-butylborate, respectively, and the prepared microcapsule solutions were mixed. Image formation and evaluation of Sample 15 were conducted similarly to Example 1 and it was proved that the sample exhibited a reflection density variation of 96%. Using three light sources having emission peaks at 450 nm, 550 nm and 650 nm, respectively, the sample was exposed with adjusting a light source intensity. Applying an electric field at ±40 V between parallel electrodes resulted in color images corresponding to the foregoing exposures. It was further proved that adding a charge controlling agent similarly to Example 8 or image formation similar to Example 3 resulted in further enhanced effects of this invention by 2% to 3%. In place of applying an electric field by parallel electrodes, the use of an ion flow electrostatic recording head led to similar results.

Example 17

Figure 10:
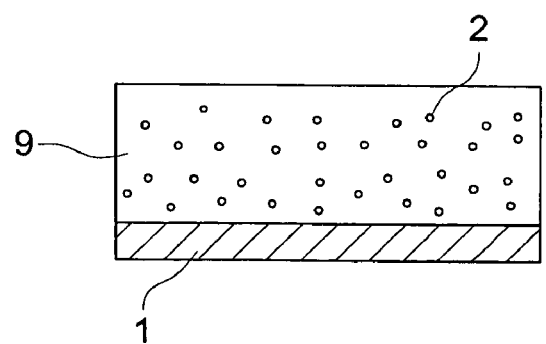
FIG. 10 illustrates another example of layer configurations.

Sample 16, as shown in FIG. 10, was prepared similarly to Sample 1, provided that carbon black used in Sample 1 was replaced by dyes (Aldrich Blue N, Aldrich Sudan Red 7B). Using Sample 16, image formation and evaluation were conducted similarly to Example 1 and it was proved that the sample exhibited a reflection density variation of 80%.

What is claimed is:

1. An image forming method comprising:
   (a) imagewise exposing a recording material comprising on a support an image forming layer containing colored electrophoretic particles and a photopolymerizable composition to light to perform photocuring and then
   (b) applying an electric field to the recording material to migrate electrophoretic particles in an unexposed area of the recording material.

2. The image forming method of claim 1, wherein the electrophoretic particles comprise white particles and black particles.

3. The image forming method of claim 1, wherein the electrophoretic particles comprise yellow particles, magenta particles and cyan particles.

4. The image forming method of claim 1, wherein the electrophoretic particles and the photopolymerizable composition are included in capsules.

5. The image forming method of claim 1, wherein the support has recesses at regular intervals.

6. The image forming method of claim 1, wherein the image forming layer contains spacer particles.

7. The image forming method of claim 1, wherein the recording material further comprises a white light-scattering layer.

8. The image forming method of claim 1, wherein the image forming layer contains a charge controlling agent.

9. The image forming method of claim 1, wherein the image forming layer contains a compound exhibiting a relative dielectric constant of 2.5 to 10.0 at 25°C.

10. The image forming method of claim 1, wherein the recording material further comprises a protective layer containing a polyvinyl alcohol.

11. The image forming method of claim 1, wherein an overall water content of component layer(s) on the side of the electrophoretic particles of the support is 0.01 to 10%.

12. The image forming method of claim 1, wherein a surface roughness (Ra) of the side of the electrophoretic particles of the recording material is 0.01 to 2.0 μm.

13. The image forming method of claim 1, wherein the image forming layer contains a thermosetting resin and the method further comprises heating the recording material at a temperature of 60 to 200°c.

14. The image forming method of claim 1, wherein the method further comprises overall exposing the recording material to light.

15. The image forming method of claim 1, wherein the recording material is exposed to light having plural peaks in the wavelength range of 400 to 700 nm.

16. An image forming method comprising:
   (a) applying an electric field to a recording material comprising on a support an image forming layer containing colored electrophoretic particles and a photopolymerizable composition to migrate the electrophoretic particles and then
   (b) imagewise exposing the recording material to light to perform photocuring.

17. The image forming method of claim 16, wherein the electrophoretic particles comprise white particles and black particles.

18. The image forming method of claim 16, wherein the electrophoretic particles comprise yellow particles, magenta particles and cyan particles.

19. The image forming method of claim 16, wherein the electrophoretic particles and the photopolymerizable composition are included in capsules.

20. The image forming method of claim 16, wherein the support has recesses at regular intervals.

21. The image forming method of claim 16, wherein the image forming layer contains spacer particles.

22. The image forming method of claim 16, wherein the recording material further comprises a white light-scattering layer.

23. The image forming method of claim 16, wherein the image forming layer contains a charge controlling agent.

24. The image forming method of claim 16, wherein the image forming layer contains a compound exhibiting a relative dielectric constant of 2.5 to 10.0 at 25°C.

25. The image forming method of claim 16, wherein the recording material further comprises a protective layer containing a polyvinyl alcohol.

26. The image forming method of claim 16, wherein an overall water content of component layer(s) on the side of the electrophoretic particles of the support is 0.01 to 10%.

27. The image forming method of claim 16, wherein a surface roughness (Ra) of the side of the electrophoretic particles of the recording material is 0.01 to 2.0 μm.

28. The image forming method of claim 16, wherein the recording material is exposed to light having plural peaks in the wavelength range of 400 to 700 nm.

* * * * *